United States Patent
Carter et al.

(10) Patent No.: US 6,900,126 B2
(45) Date of Patent: May 31, 2005

(54) METHOD OF FORMING METALLIZED PATTERN

(75) Inventors: Kenneth Raymond Carter, San Jose, CA (US); Mark Whitney Hart, San Jose, CA (US); Craig Jon Hawker, Los Gatos, CA (US); John Campbell Scott, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 174 days.

(21) Appl. No.: 10/301,318

(22) Filed: Nov. 20, 2002

(65) Prior Publication Data

US 2004/0097072 A1 May 20, 2004

(51) Int. Cl.[7] .................... H01L 21/44; H01L 21/3205; H01L 21/4763
(52) U.S. Cl. ...................... 438/678; 438/586; 438/612; 438/613
(58) Field of Search ........................................ 438/586

(56) References Cited

U.S. PATENT DOCUMENTS

| | | |
|---|---|---|
| 3,640,789 A | 2/1972 | Hepter |
| 4,006,047 A | 2/1977 | Brummett et al. |
| 4,100,037 A | 7/1978 | Baron et al. |
| 4,555,414 A | 11/1985 | Hoover et al. |
| 4,701,351 A | 10/1987 | Jackson |
| 5,084,299 A | 1/1992 | Hirsch et al. |
| 5,112,434 A | 5/1992 | Goldberg |
| 5,173,442 A | 12/1992 | Carey |
| 5,681,441 A | 10/1997 | Svendsen et al. |
| 6,165,911 A | 12/2000 | Calveley |
| 6,180,239 B1 | 1/2001 | Whitesides et al. |
| 6,207,351 B1 | 3/2001 | Cywar et al. |
| 6,309,580 B1 * | 10/2001 | Chou .......................... 264/338 |
| 6,326,303 B1 | 12/2001 | Robinson et al. |
| 6,402,866 B1 | 6/2002 | Casey et al. |
| 6,660,192 B1 * | 12/2003 | Kim et al. .................. 264/1.27 |
| 2001/0044225 A1 * | 11/2001 | Eldridge et al. ............... 439/66 |

FOREIGN PATENT DOCUMENTS

| | | | |
|---|---|---|---|
| JP | 361185338 A | * | 8/1986 |
| JP | 361185339 A | * | 8/1986 |
| JP | 408134389 A | * | 5/1996 |
| JP | 409194733 A | * | 7/1997 |
| JP | 2000-129211 | | 9/2000 |
| JP | 2001-131758 | | 5/2001 |
| WO | WO 00/54107 | | 9/2000 |

OTHER PUBLICATIONS

L. T. Ramankiw, "Patterning by 'Rubber Stamping'", Research Disclosure Bulletin, No. 269, Sep. 1986.
Eldridge et al., "Method for forming microelectronic spring structures on a substrate". United States Patent Application Publication, Nov. 22, 2001, U.S. Appl. No. 09/781,833.
Boone, "Process for producing three–dimensional, selectively metallized parts, and three–dimensional, selectively metallized part". United States Patent Application Publication, Nov. 29, 2001, U.S. Appl. No. 09/835,335.
Voss, "Primer for metallizing substrate surfaces", United States Patent Application Publication, Jan. 3, 2002, U.S. Appl. No. 09/757,810.

* cited by examiner

*Primary Examiner*—Matthew Smith
*Assistant Examiner*—Chuong Anh Luu
(74) *Attorney, Agent, or Firm*—Daniel E. Johnson

(57) ABSTRACT

High density circuitry and metallic patterns are grown from polymer that has been patterned using a contact molding process. The patterned polymer is either intrinsically seedable or treated to make it seedable, e.g., it may be seeded with metallic seed ions, such as Pd ions. The patterned polymer is placed in an electroless deposition bath, with metal being plated onto its surface. Using these methods, metal (e.g, copper) may be deposited onto substrates of either organic or inorganic dielectric materials. The dielectric materials may comprise epoxy resins, ceramics, semiconductors (Si), glass, and silicon oxide.

37 Claims, 4 Drawing Sheets

METHOD OF FORMING METALLIZED PATTERN

TECHNICAL FIELD

The invention relates generally to methods of creating patterns of metal or circuitization on a substrate. More particularly, the invention relates to electrolessly plating polymeric patterns created via imprint lithography.

BACKGROUND

There continues to be an effort in the microelectronics industry to increase the density of circuit features in a way that favors economies of scale. Photolithography has proven to be a very successful technique for manufacturing integrated circuits (ICs) having narrow linewidths, and there is every expectation that it will continue to be useful in the production of ICs at ever higher resolution for at least the next several years.

As part of the IC manufacturing process, metal is deposited onto a substrate, with the metal being etched to form nanoscale size features that define the workings of the IC. One way of laying down metal is to electrolessly deposit it. In conventional methods of forming circuitization by electroless plating onto dielectric materials, a seeding or catalyst layer is first blanket deposited on the substrate. Next, a negative resist (typically a photoresist) is applied over the seed layer, followed by exposing the photoresist to electromagnetic radiation to form a desired image. The photoresist is then exposed to a developer, i.e., a solvent that dissolves the unexposed portions of the photoresist, leaving the exposed portions of the photoresist over the seed layer. (The analogous positive resist processes are also possible.) Those portions of the photoresist that are removed by the developer correspond to the metal pattern of the circuitization for the circuit board. Typically, several processing steps are performed to accelerate the catalyst, modify the seed layer, and so on. Thereafter, metal is electrolessly plated onto the bare, exposed portions of the seed layer, that is, the portions of the seed layer that are not covered by the photoresist. The polymerized photoresist is then stripped using stripping solvents. As a result, portions of the seed layer are covered by metal circuitization, while portions of the seed layer are exposed.

After plating, the exposed portion of the seed layer can be stripped (that is, the portion of the seed layer that is not covered by the electrolessly plated metal). If the entire seed layer were to remain, the metal in the seed layer might conduct current from one electrical line in the circuit to another electrical line, thereby creating a short circuit. If the exposed portions of the seed layer are to be stripped, another processing step is required. Moreover, the solvents needed to remove the seed layer (for example, alkaline cyanide solutions) often present environmental problems, e.g., such as those related to waste disposal. Furthermore, such solvents often attack and degrade the circuitry and the dielectric materials.

There is still a need for a method of forming circuitization by electrolessly plating metal that does not involve a blanket seed layer, that is simple to perform, and that does not require stripping of the seed layer. From a manufacturing standpoint, it would also be advantageous to reduce both the complexity and the number of process steps.

SUMMARY OF THE INVENTION

Preferred implementations of the invention involve electrolessly plating polymeric patterns created via imprint lithography. A suitable polymeric composition is patterned by imprint lithography (or contact molding) followed by treatment with a metallic seed layer (e.g., the polymeric composition may be treated with Pd ions in solution). The seeded, patterned polymer can then be placed in an electroless plating bath, thereby resulting in metallation of the seeded polymeric layer and the formation of patterned metallic regions. This is a reproducible process that permits the mass production and reproduction of sub-micron sized metal features and circuitry.

A preferred implementation of the invention is a method of forming metallized features on a substrate. The method includes applying a layer of a polymerizable composition onto a substrate, contacting the layer with a mold having protrusions thereon to form a pattern in the layer, curing the polymerizable composition (thereby forming a cured polymeric layer), and removing the mold from the cured polymeric layer. The method further includes applying to the cured polymeric layer a seeding composition having a species that forms a complex at sites on the cured polymeric layer (in which the sites act as acceptor sites to which a preselected metal can be bound), with portions of the substrate corresponding to areas contacted by the protrusions being free of polymeric material prior to applying the seeding composition. Metallized features are formed by electrolessly depositing a film of the preselected metal onto the cured polymeric layer, in which the substrate remains substantially free of any sites to which the preselected metal would bind while the seeding composition is applied, to reduce the amount of metal deposited onto the substrate. In a preferred implementation of this method, the contact of the mold with the layer displaces the polymerizable composition, so that upon removing the mold from the cured polymeric layer, portions of the substrate are substantially free of polymeric material. The method may further include a descumming procedure to remove unwanted polymeric material from the substrate, with this descumming procedure being carried out prior to applying the seeding composition. The cured polymeric layer may be treated to make it seedable, or it may be intrinsically seedable, e.g., the polymeric material may include a photocurable composition which when cured is intrinsically seedable. The curing may also include heating the layer while the layer is in contact with the mold.

Another implementation of the invention is a method of forming metallic features. The method includes applying a layer on a substrate, in which the layer includes a photocurable material that becomes seedable as a result of being photocured. A pattern is formed in the layer, the patterned layer is photocured to form a seedable material, and the photocured, patterned layer is seeded to form sites thereon where metal can be bound. The method further includes depositing metal on the seeded layer to form metallic features. In a preferred implementation, metal may be electrolessly deposited onto the seeded layer. In one preferred implementation, the substrate remains substantially unseeded. In one preferred implementation, areas of the substrate are free from the photocured layer, with these areas lying between regions of the substrate covered by the photocured layer.

Yet another implementation of the invention is a method that includes positioning a layer of material on a substrate, bringing a mold having protrusions thereon into contact with the layer to form a pattern in the layer, removing the mold from the patterned layer, seeding the patterned layer without seeding the substrate, and electrolessly depositing metal onto the patterned layer. In a preferred implementation, the mold displaces the polymerizable composition, so that upon removing the mold from the patterned layer, portions of the substrate are substantially free of polymeric material. In one preferred implementation, the method includes photocuring the polymerizable composition. The cured material may be intrinsically seedable.

BRIEF DESCRIPTION OF THE DRAWINGS

FIGS. 1–9 illustrate a preferred implementation of the invention, in which:

FIG. 1 shows a substrate;

FIG. 2 shows a substrate onto which has been applied a layer that includes polymerizable material;

FIG. 3 shows a patterned mold being brought into contact with the material;

FIG. 4 shows the patterned mold in contact with the material;

FIG. 5 shows the mold being released from the substrate;

FIG. 6 shows a patterned polymeric layer formed by the mold, and how heat may be applied to better cure the layer;

FIG. 7 is a cross sectional view of the cured, patterned layer of FIG. 6;

FIG. 8 is a cross sectional view showing a seed layer that has been applied to the cured, patterned layer of FIG. 7; and FIG. 9 is a cross sectional view showing a film of metal that has been added to the seed layer shown in FIG. 8.

FIGS. 10–11 illustrate a working example, in which:

FIG. 10 shows a thin, patterned film of cured photopolymer; and

FIG. 11 shows the photopolymer of FIG. 10 after it has been descummed, seeded and plated.

DETAILED DESCRIPTION OF THE INVENTION

Figure 1:
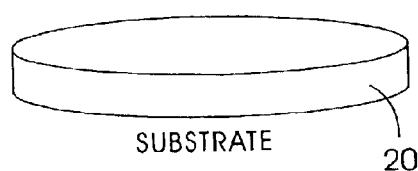

Preferred embodiments of the present invention relate to processes for manufacturing metallic features and/or metallic patterns, such as those in an integrated circuit device, and are now described in connection with the accompanying figures. FIG. 1 shows a substrate 20, which may include an organic or inorganic dielectric material. The substrate 20 may include a semiconductor (such as silicon), silicon dioxide, glass, silicon nitride, ceramics, aluminum, copper, gallium arsenide, epoxy resins or another suitable substance known to those skilled in the art.

Figure 2:
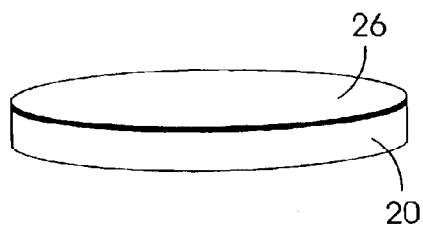

As illustrated in FIG. 2, a layer 26 of material is deposited onto the substrate 20. The layer 26 may deposited, for example, through spin casting, meniscus-bead coating, dip coating, spray coating, or doctor blading. The layer 26 preferably includes a polymeric material or a precursor to a polymeric material (e.g., a mixture of polymerizable monomers, such as trimethylolpropane triacrylate, N-vinylpyrolidone, ethoxylated (3) bisphenol A dimethacrylate, 1,6 hexanediol dimethacrylate, pentaerythritol triacrylate, tripropylene glycol diacrylate, and pentaerythritol tetraacrylate), which may be (prior to being deposited on the substrate 20) advantageously dissolved in a suitable solvent such as dimethyl propylene urea (DMPU), NMP, PM-acetate, γ-butyrolactone or the like. One preferred photopolymer solution includes the monomers ethoxylated bisphenol-A dimethacrylate (61 wt. %), N-vinyl pyrrolidone (18.5 wt. %), 2-ethyl-2-(hydroxymethyl)-1,3-propanediol triacrylate (18.5 wt. %), and the photoinitiator 2,2-dimethoxy-2-phenylacetophenone (2 wt. %); these monomers and photoinitiator were mixed and then refrigerated (in the dark) prior to use.

The material of layer 26 may include a spin-on, high temperature polymer (such as a polyimide), an organic thermosetting material (such as Dow Chemical Company's SiLK® product described in U.S. Pat. Nos. 5,965,679 and 6,288,188 to Godschalx et al.), an inorganic or organic polysilica (e.g., a polysilsesquioxane, such as those described in U.S. Pat. Nos. 6,143,643 and 6,177,360 to Carter et al.). If a polymeric material is deposited on the substrate 20, it may (depending upon the polymeric material selected) undergo some degree of crosslinking or, alternatively, it might not undergo any significant cross linking, even upon curing. Other materials suitable for deposition on the substrate 20 include those known to one skilled in the art, such as those described in the Background. Alternatively, the material in the layer 26 may include a thermoplastic material, as discussed below.

Figure 3:
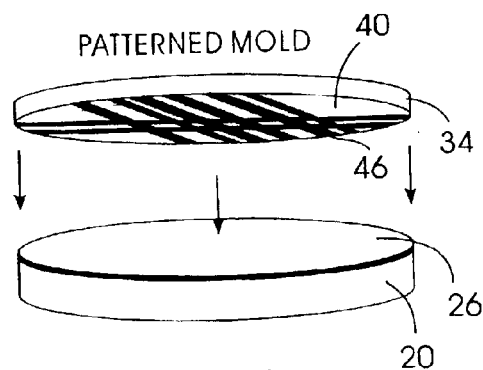

As indicated in FIG. 3, the layer 26 is then brought into contact with a mold 34 having an appropriately patterned surface 40. The surface 40 advantageously includes a pattern of protrusions or relief structures 46 (features) having characteristic dimensions in the range of, for example, 10 nanometers to 100 microns, more preferably 10 nanometers to 1 micron, and still more preferably 10 to 80 nanometers. When the mold 34 is brought into contact with the layer 26 on the substrate 20, the relief structures 46 impart a pattern to the layer 26 that corresponds to the inverse of the pattern on the surface 40. The mold 34 is advantageously comprised of material that is sufficiently rigid to impart a pattern to the layer 26. Preferred mold materials include a polymeric material (such as a polymethacrylate or a polyacrylate), metal, silicon, an organic polymer, a siloxane polymer, borosilicate glass, a fluorocarbon polymer, and combinations thereof.

Figure 4:
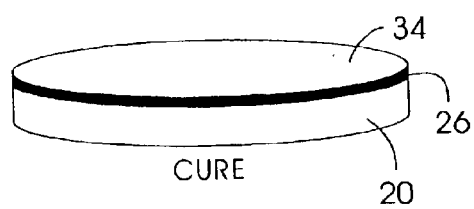

The layer 26 is then cured to form a cured, polymeric layer. One way of doing this is shown in FIG. 4, in which heat is applied to the substrate 20 and/or the mold 34, so that heat is transferred to the layer 26, thereby effecting solvent removal and/or partial or full curing of the material in the layer 26. For example, if a spin-on-glass (SOG) resin is used, cross condensation of the polysilica silyl reactive groups can be expected to occur. The material in the layer 26 may advantageously include a base such as an amine or Bronsted base to lower the condensation temperature. If an amine is used, it may advantageously be an organic amine, preferably one that has a boiling point greater than 150° C. and is removable by heating upon completion of the reaction. One suitable base is N-methyldiethanolamine (having a boiling point of about 246–248° C.), and other suitable bases are known to those skilled in the art, such as those disclosed in U.S. Pat. No. 5,206,117 to Labadie et al. Other catalysts which facilitate the condensation may also be used.

If the material in the layer 26 is a pressure sensitive material (such as a thermoplastic) rather than a heat sensitive material, applying pressure alone may be sufficient to mold the layer 26 (e.g., by inducing a chemical change in the material) and thereby impart a pattern to it. Preferred thermoplastics may include polyimides, polystyrenes, polymethacrylates, polyacrylates, polyarylethers, polyesters, polynorbornenes, and the like. Curing may also be accomplished by chemical curing, e.g., the exposure of monomers to a gaseous cross-linker.

Alternatively, the layer 26 may include a polymerizable composition that cures upon being exposed to electromagnetic radiation, such as ultraviolet light. To this end, the layer 26 may advantageously include, in addition to the polymerizable composition, a photoinitiator (such as 2,2-dimethoxy-2-phenylacetophenone, 1-hydroxy-cyclohexyl-phenylketone, ethyl 4-(dimethylamino) benzoate, or 2-hydroxy-2-methyl-1-phenyl propanone). If a solvent is used, it may evaporate either before, during, or after exposure to the ultraviolet light.

Figure 5:
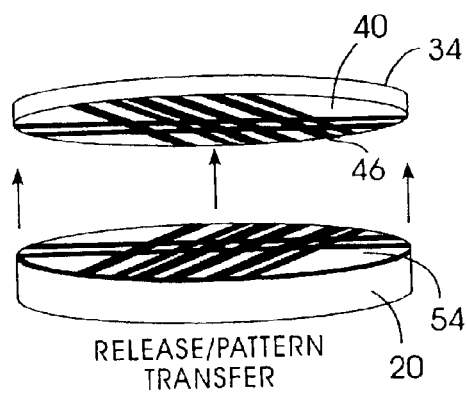
Figure 6:
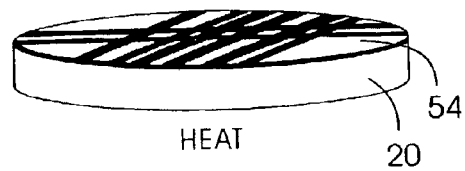
Figure 7:
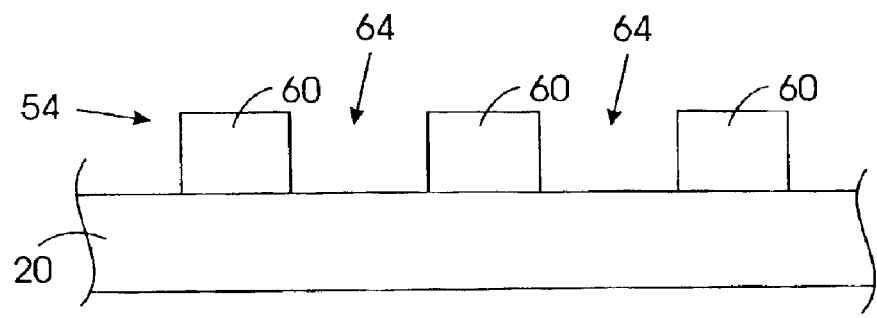

As indicated in FIG. 5, after curing, the mold 34 may be released from the substrate 20. This leaves, as shown in FIG. 6, a patterned, cured polymeric layer 54 that includes raised regions 60. FIG. 7 shows the patterned layer 54/substrate 20 in cross section. Thermal treatments may also be employed to ensure that the patterned layer 54 has been completely cured. The relief structures 46 that make up the molding surface 40 of the mold 34 are preferably made of a polymeric material (such as a polymethacrylate or a polyacrylate, or an elastomeric material such as polysiloxane (e.g., polydimethylsiloxane or PDMS), rubber, or polyurethane), so that when pressure is applied to the mold 34 as it is brought into contact with the substrate 20 (as shown in FIG. 3), the material of the layer 26 is confined to the raised regions 60. In this way, the valleys or areas 64 between the raised regions 60 are at least substantially free of the material that makes up the layer 26; the best results are obtained when the relief structures 46 are made of a polymethacrylate or a polyacrylate. If the valleys 64 are not free of residual polymeric material (i.e., if the substrate 20 in the valleys is partially or completely covered), then a descumming procedure may be required to remove this material. This descumming may include an etching procedure, for example.

At this point, the patterned layer 54 can be treated to make it seedable. For example, the layer 54 may be chemically etched using one of a number of etchants that induces a desired chemical modification of the layer 54, such as chromic acid or sulfuric acid. Alternatively, the layer 54 may be subjected to a plasma etch process, in which a plasma is directed onto the layer, thereby inducing a desired chemical modification of the layer. Other ways of treating the layer 54 to make it seedable are i) exposing it to ultraviolet light/ozone and ii) subjecting it to an alkaline base treatment.

If the layer 54 is intrinsically seedable, however, then no special treating process may be required. For example, the layer 54 may be intrinsically seedable if one or more of the monomers in the layer 26 contains functionality that facilitates the coordination of palladium (Pd), with this monomer forming part of the layer 54. One way to accomplish this is to include methacrylic acid in the layer 26, in which case the carboxylate moiety in the methacrylic acid facilitates the coordination of palladium. Another monomer that contains such desirable coordination functionality is N,N-di-(2'-pyridyl)-2-methyl-2-propenamide, which may be synthesized by adding N,N-di-(2'-pyridyl)-amine to methacryloyl chloride, followed by purification by chromatography. The functionality-containing monomer may be 5–30 wt. % of the total mixture. (For example, the photopolymer solution may include the monomers ethoxylated bisphenol-A dimethacrylate (48.8 wt. %), N-vinyl pyrrolidone (14.8 wt. %), 2-ethyl-2-(hydroxymethyl)-1,3-propanediol triacrylate (14.8 wt. %), the photoinitiator 2,2-dimethoxy-2-phenylacetophenone (1.6 wt. %), and the functionality-containing monomer methacrylic acid (20 wt. %).)

Figure 8:
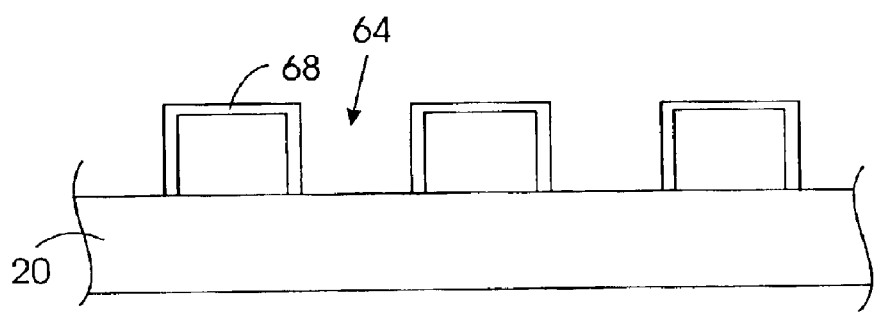

The patterned, cured polymeric layer 54 is seeded, preferably by soaking the layer 54 in a solution that has suitable seed ions, e.g., a $Pd^{2+}$ solution such as palladium acetate, palladium sulfate, and palladium chloride. This procedure preferentially seeds the layer 54 without seeding the substrate 20, so that a complex is formed at sites on the layer 54, with the sites acting as acceptor sites to which a metal (such as copper) can be bound. The result is a thin seed layer 68 over the patterned layer 54, as shown in FIG. 8.

Figure 9:
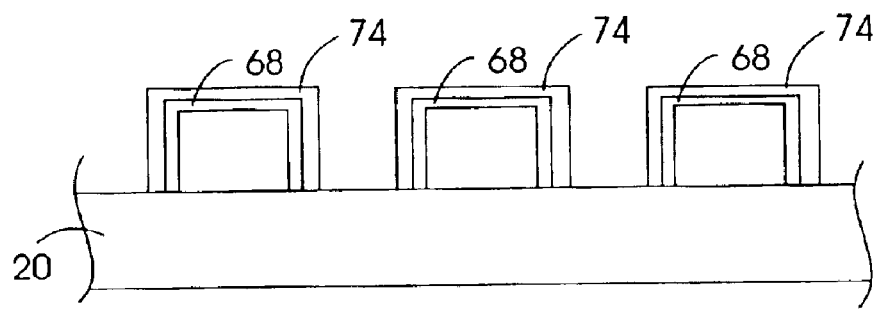

Next, an electroless deposition procedure may be carried out by placing the substrate 20/layer 54/seed layer 68 in a plating bath (such as a copper bath). After the plating procedure is completed, the substrate 20 (with the various layers thereon) is removed from the bath. One such plating bath is disclosed in U.S. Pat. No. 3,844,799 to Undkofier et al. A layer of metal 74 is deposited onto the seed layer 68, as shown in FIG. 9, with the metal 74 preferably covering all of the seed layer. In this manner, the metal 74 is plated in the desired circuit pattern.

EXAMPLE

Creation of Patterned Template

Figure 10:
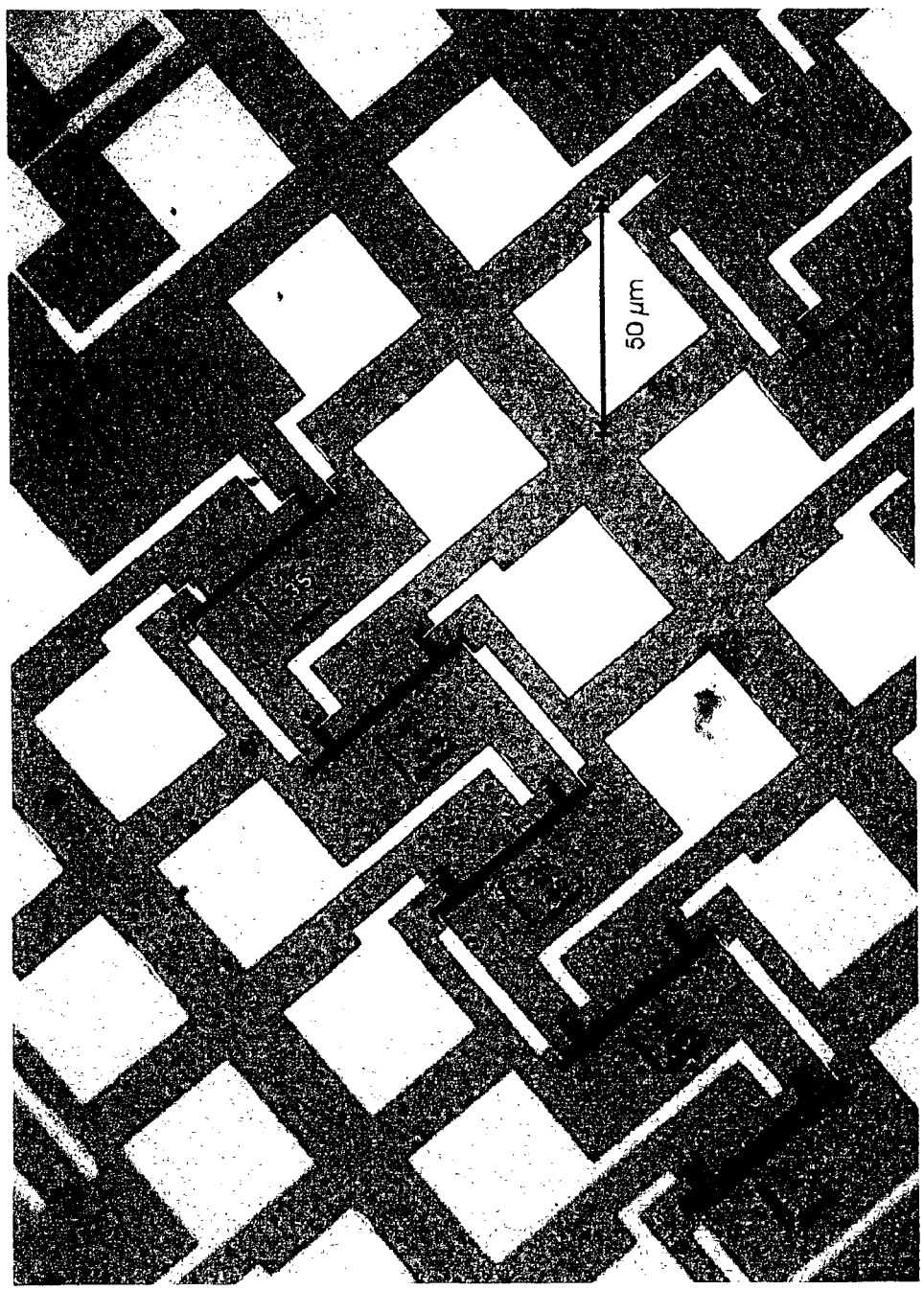

A photopolymerizable resin composition was formulated consisting of 61 parts ethoxylated bisphenol-A dimethacrylate, 18.5 parts N-vinyl pyrrolidone, 18.5 parts 2-ethyl-2-(hydroxymethl)-1,3-propanediol trimethacrylate, and 2 parts 2,2-dimethoxy-2-phenylacetophenone (2%). The resin solution was spin-coated @ 4000 rpm onto a polished silicon wafer. The thin film was placed into contact with a transparent mold consisting of a patterned photopolymerized acrylate resin; for 10 minutes the thin film was put under 100 PSI of pressure while being exposed to UV radiation (400 nm at 20 $mW/cm^2$). The mold was removed yielding a thin patterned film of cured photopolymer, as shown in FIG. 10, in which the photopolymer is visible as dark areas on top of the substrate (which is visible as the white areas). Next, the patterned wafer was descummed by placing it in an oxygen plasma for 3 seconds. This oxygen plasma treatment has the advantageous effect of activating the polymer surface for polymer seeding.

Seeding of Patterned Template

The wafer with the patterned polymer layer was placed in a seeding bath consisting of 0.6 mM palladium acetate in methanol for 30 minutes, then rinsed extensively with water and dried under a stream of compressed air. This resulted in a layer of $Pd^{2+}$ ions being chemically associated with the patterned polymer surface.

Electroless Plating of Copper Metal on Patterned Template

Figure 11:
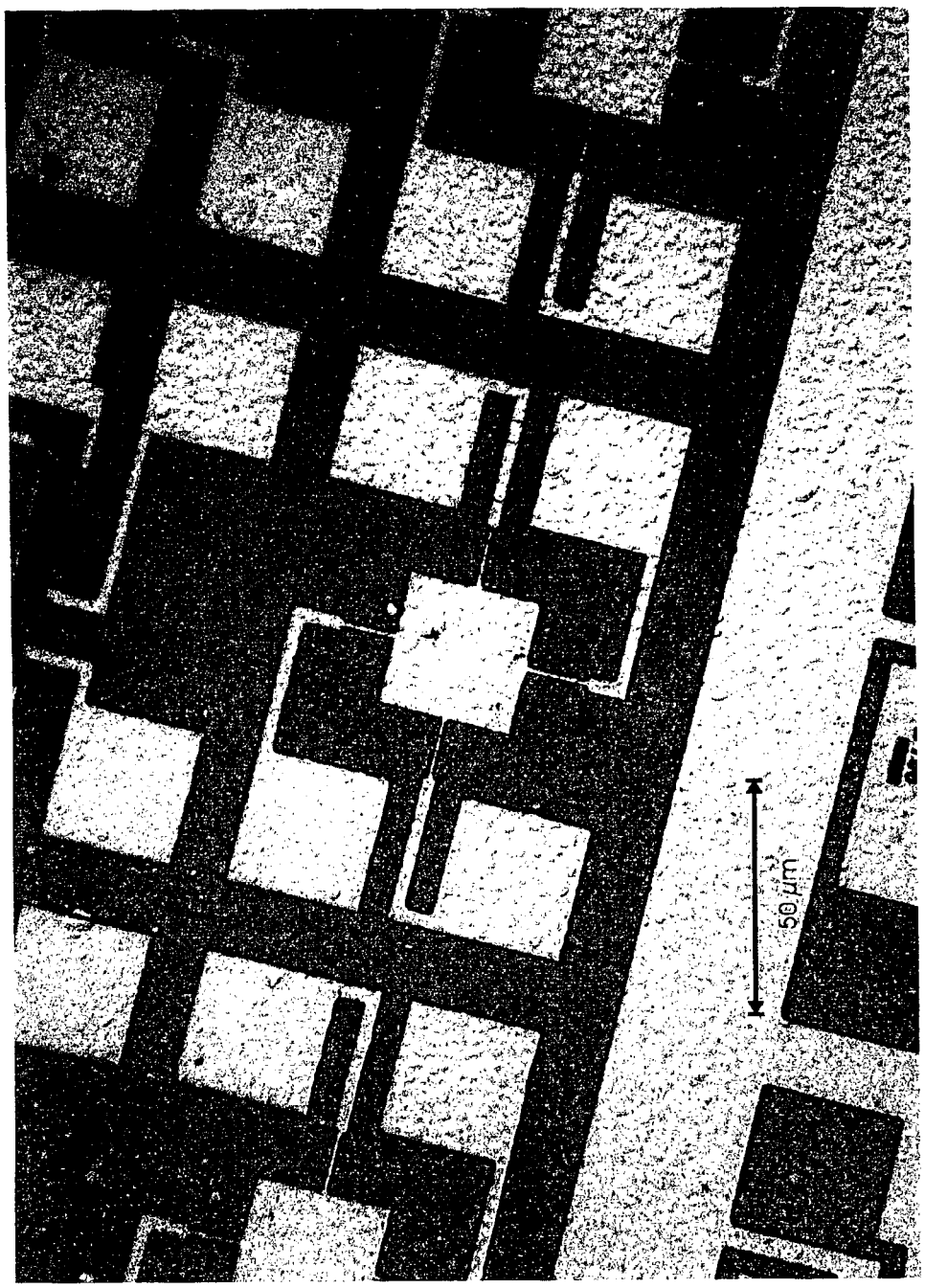

The wafer with the seeded patterned polymer layer was placed in a electroless plating bath consisting of $CuSO_4$ X $H_2O$ (28.0 mM), K Na tartrate (88.0 mM), NaOH (100 mM), and Formaldehyde (130 mM) in water. Copper metal plating from the surface of the patterned layer was observed, as shown in FIG. 11, in which the copper metal plating is visible as white areas on top of the substrate (which is visible in this figure as the dark areas).

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

What is claimed is:

1. A method of forming metallized features on a substrate, comprising:

applying a layer of a polymerizable composition onto a substrate;

contacting the layer with a mold having protrusions thereon to form a pattern in the layer;

curing the polymerizable composition, thereby forming a cured polymeric layer;

removing the mold from the cured polymeric layer;

applying to the cured polymeric layer a seeding composition having a species that forms a complex at sites on the cured polymeric layer, the sites acting as acceptor sites to which a preselected metal can be bound, wherein portions of the substrate corresponding to areas contacted by the protrusions are free of polymeric material prior to said applying of the seeding composition; and forming metallized features by electrolessly depositing a film of the preselected metal onto the cured polymeric layer, wherein during said application of the seeding composition the substrate remains substantially free of any sites to which the preselected metal would bind, to reduce the amount of metal deposited onto the substrate.

2. The method of claim 1, wherein said contact of the mold with the layer displaces the polymerizable composition, so that upon removing the mold from the cured polymeric layer, portions of the substrate are substantially free of polymeric material.

3. The method of claim 2, wherein the protrusions of the mold are made from a polymeric material.

4. The method of claim 3, wherein said polymeric material includes a polymethacrylate or a polyacrylate.

5. The method of claim 1, comprising a descumming procedure to remove unwanted polymeric material from the substrate, said descumming occurring prior to said applying of the seeding composition.

6. The method of claim 1, said curing including photocuring.

7. The method of claim 1, further comprising treating the cured polymeric layer to make it seedable.

8. The method of claim 7, comprising applying an alkaline base treatment to the cured polymeric layer to make it seedable.

9. The method of claim 7, comprising applying a chemical etch process to the cured polymeric layer to make it seedable.

10. The method of claim 7, comprising applying a plasma etch to the cured polymeric layer to make it seedable.

11. The method of claim 1, wherein the cured polymeric layer is intrinsically seedable.

12. The method of claim 11, wherein the polymeric material includes a photocurable composition which when cured is intrinsically seedable.

13. The method of claim 12, wherein the photocurable composition includes reagents that act as Pd binding sites.

14. The method of claim 1, wherein the cured polymeric layer includes a thermoplastic material.

15. The method of claim 1, wherein the cured polymeric layer includes a thermoset material.

16. The method of claim 1, wherein the applied layer includes a solution that contains monomers.

17. The method of claim 1, said curing including heating the layer while the layer is in contact with the mold.

18. A method of forming metallic features, comprising:

applying a layer on a substrate, the layer including a photocurable material that becomes seedable as a result of being photocured;

forming a pattern in the layer;

photocuring the patterned layer to form a seedable material;

seeding the photocured, patterned layer by applying a solution to it to form sites thereon where metal can be bound; and depositing metal on the seeded layer to form metallic features.

19. The method of claim 18, wherein the substrate remains substantially unseeded during said depositing.

20. The method of claim 18, wherein the photocurable material includes a polymeric material.

21. The method of claim 18, said depositing including electrolessly depositing metal onto the seeded layer.

22. The method of claim 18, wherein the photocurable material includes reagents that act as Pd binding sites.

23. The method of claim 18, wherein, during said depositing, areas of the substrate are free from the photocured layer, said areas lying between regions of the substrate covered by the photocured layer.

24. A method, comprising:

positioning a layer of material on a substrate;

bringing a mold having protrusions thereon into contact with the layer to form a pattern in the layer;

removing the mold from the patterned layer;

using a solution to send the patterned layer without seeding the substrate; and electrolessly depositing metal onto the patterned layer.

25. The method of claim 24, wherein the layer includes a polymerizable composition.

26. The method of claim 25, wherein the mold displaces the polymerizable composition, so that upon removing the mold from the patterned layer, portions of the substrate are substantially free of polymeric material.

27. The method of claim 25, further comprising photocuring the polymerizable composition.

28. The method of claim 24, comprising curing the material, wherein the cured material is intrinsically seedable.

29. The method of claim 24, in which the protrusions have characteristic dimensions of between 10 nanometers and 80 nanometers.

30. The method of claim 16, wherein the monomers include functionality that facilitates the coordination of Pd.

31. The method of claim 25, wherein the composition includes functionality that facilitates the coordination of Pd.

32. The method of claim 1, wherein the seeding composition is applied with a solution.

33. The method of claim 1, wherein the metallized features form part of an integrated circuit.

34. The method of claim 18, wherein the metallic features form part of an integrated circuit.

35. The method of claim 24, wherein the deposited metal forms part of an integrated circuit.

36. A method of forming metallic features, comprising;

applying a layer on a substrate, the layer including a photocurable material that becomes seedable as a result of being photocured, wherein the photocurable material includes reagents that act as Pd binding sites;

forming a pattern In the layer;

photocuring the patterned layer to form a seedable material;

seeding the photocured, patterned layer to form sites thereon where metal can be bound; and depositing metal on the seeded layer to form metallic features.

37. A method of forming metallic features, comprising:

applying a layer on a substrate, the layer including a photocurable material that becomes seedable as a result of being photocured forming a pattern in the layer;

photocuring the patterned layer to form a seedable material;

seeding the photocured, patterned layer to form sites thereon where metal can be bound; and depositing metal on the seeded layer to form metallic features.

* * * * *

UNITED STATES PATENT AND TRADEMARK OFFICE
CERTIFICATE OF CORRECTION

PATENT NO. : 6,900,126 B2
DATED : May 31, 2005
INVENTOR(S) : Kenneth R. Carter et al.

It is certified that error appears in the above-identified patent and that said Letters Patent is hereby corrected as shown below:

Column 8,
Line 16, replace "send" with -- seed --.

Signed and Sealed this

Ninth Day of May, 2006

JON W. DUDAS
*Director of the United States Patent and Trademark Office*